(12) United States Patent
Shang et al.

(10) Patent No.: US 11,614,551 B2
(45) Date of Patent: Mar. 28, 2023

(54) DETECTION SUBSTRATE, MANUFACTURING METHOD THEREOF, AND RAY DETECTOR

(71) Applicants: Beijing BOE Sensor Technology Co., Ltd., Beijing (CN); BOE Technology Group Co., Ltd., Beijing (CN)

(72) Inventors: Jianxing Shang, Beijing (CN); Xuecheng Hou, Beijing (CN); Zhenyu Wang, Beijing (CN); Ziran Liu, Beijing (CN); Chuang Yong, Beijing (CN)

(73) Assignees: Beijing BOE Sensor Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/351,566

(22) Filed: Jun. 18, 2021

(65) Prior Publication Data

US 2022/0163684 A1 May 26, 2022

(30) Foreign Application Priority Data

Nov. 23, 2020 (CN) .......................... 202011322997.4

(51) Int. Cl.
  *G01T 1/24* (2006.01)
  *G01N 23/083* (2018.01)
  *H01L 27/146* (2006.01)

(52) U.S. Cl.
  CPC ............. *G01T 1/24* (2013.01); *G01N 23/083* (2013.01); *H01L 27/14659* (2013.01); *H01L 27/14663* (2013.01); *H01L 27/14689* (2013.01)

(58) Field of Classification Search
  CPC ... G01T 1/24; G01N 23/083; H01L 27/14659; H01L 27/14663; H01L 27/14689
  See application file for complete search history.

(56) References Cited

U.S. PATENT DOCUMENTS

2003/0107002 A1\* 6/2003 Rougeot ........... H01L 27/14658
  250/370.11
2017/0040368 A1\* 2/2017 Grzesik ............. H01L 27/14623

\* cited by examiner

*Primary Examiner* — Hugh Maupin
(74) *Attorney, Agent, or Firm* — Workman Nydegger

(57) ABSTRACT

The present disclosure provides a detection substrate, a manufacturing method thereof and a ray detector. The detection substrate includes: a base substrate; a plurality of independent first electrodes arranged on the base substrate on the same layer; a photoelectric conversion layer arranged on a whole face of sides, facing away from the base substrate, of the plurality of first electrodes; a ray absorption layer arranged on a side, facing away from the plurality of first electrodes, of the photoelectric conversion layer, wherein an orthographic projection of the ray absorption layer on the base substrate is overlapped with an orthographic projection of gaps between the first electrodes on the base substrate; and a second electrode arranged on a whole face of a side, facing away from the plurality of first electrodes, of the photoelectric conversion layer.

15 Claims, 11 Drawing Sheets

DETECTION SUBSTRATE, MANUFACTURING METHOD THEREOF, AND RAY DETECTOR

CROSS-REFERENCE TO RELATED APPLICATION

This application is based on and claims priority under 35 U.S.C 119 to Chinese Patent Application No. 202011322997.4, filed on Nov. 23, 2020, in the China National Intellectual Property Administration. The entire disclosure of the above application is incorporated herein by reference.

FIELD

The present disclosure relates to the technical field of display, in particular to a detection substrate, a manufacturing method thereof, and a ray detector.

BACKGROUND

The X-ray detection technology is widely applied to the fields such as industrial nondestructive detection, container scanning, circuit board check, medicine, security and industry, and has wide application prospects. The traditional X-Ray imaging technology belongs to analog signal imaging, the resolution is not high, and the image quality is poor. According to the X-ray digital radio graphy (DR) appeared in the late 1990s, X images are directly converted into digital images through an X-ray flat detector, the DR has the remarkable advantages that the operation is convenient, the imaging speed is high, the imaging resolution is high, the converted digital images are clear, and the digital images are easily saved and transmitted, and therefore the DR becomes the predominating direction of the digital X-ray photography technology and is accepted by clinical institutions and imaging specialists of countries in the world.

SUMMARY

A detection substrate provided by some embodiments of the present disclosure, includes:
a base substrate;
a plurality of independent first electrodes arranged on the base substrate on the same layer;
a photoelectric conversion layer arranged on a whole face of sides, facing away from the base substrate, of the plurality of first electrodes;
a ray absorption layer located on a side, facing away from the plurality of first electrodes, of the photoelectric conversion layer, wherein an orthographic projection of the ray absorption layer on the base substrate is overlapped with an orthographic projection of gaps between the first electrodes on the base substrate; and
a second electrode arranged on a whole face of a side, facing away from the plurality of first electrodes, of the photoelectric conversion layer.

Optionally, in the detection substrate provided by some embodiments of the present disclosure, the orthographic projection of the ray absorption layer on the base substrate is completely overlapped with the orthographic projection of the gaps between the first electrodes on the base substrate.

Optionally, in the detection substrate provided by some embodiments of the present disclosure, the ray absorption layer is made of at least one of heavy metal, heavy metal alloy and a heavy metal compound.

Optionally, in the detection substrate provided by some embodiments of the present disclosure, the ray absorption layer is located between the photoelectric conversion layer and the second electrode, or the ray absorption layer is located on a side, facing away from the photoelectric conversion layer, of the second electrode.

Optionally, in the detection substrate provided by some embodiments of the present disclosure, the ray absorption layer directly makes contact with the second electrode.

Optionally, the detection substrate provided by some embodiments of the present disclosure further includes scanning signal lines and reading signal lines located between the base substrate and a layer where the plurality of first electrodes are located; wherein
the orthographic projection of the ray absorption layer on the base substrate completely covers an orthographic projection of the scanning signal lines and the reading signal lines on the base substrate.

Optionally, in the detection substrate provided by some embodiments of the present disclosure, the photoelectric conversion layer is a direct conversion material layer or an indirect conversion material layer.

Optionally, the detection substrate provided by some embodiments of the present disclosure further includes: a plurality of detection circuits located on a side, facing the plurality of first electrodes, of the base substrate, wherein each detection circuit is electrically connected with one first electrode correspondingly.

Based on the same inventive concept, some embodiment of the present disclosure further provide a manufacturing method of the detection substrate, including:
providing a base substrate;
forming a plurality of first electrodes on the base substrate;
forming a photoelectric conversion layer arranged on a whole face on a layer where the plurality of first electrodes are located; and
forming or attaching a ray absorption layer on a side, facing away from the plurality of first electrodes, of the photoelectric conversion layer and forming a second electrode arranged on a whole face on the photoelectric conversion layer, wherein an orthographic projection of the ray absorption layer on the base substrate is overlapped with an orthographic projection of gaps between the first electrodes on the base substrate.

Based on the same inventive concept, some embodiments of the present disclosure further provide a ray detector, including the detection substrate according to above embodiments.

DETAILED DESCRIPTION OF THE EMBODIMENTS

Figure 1:
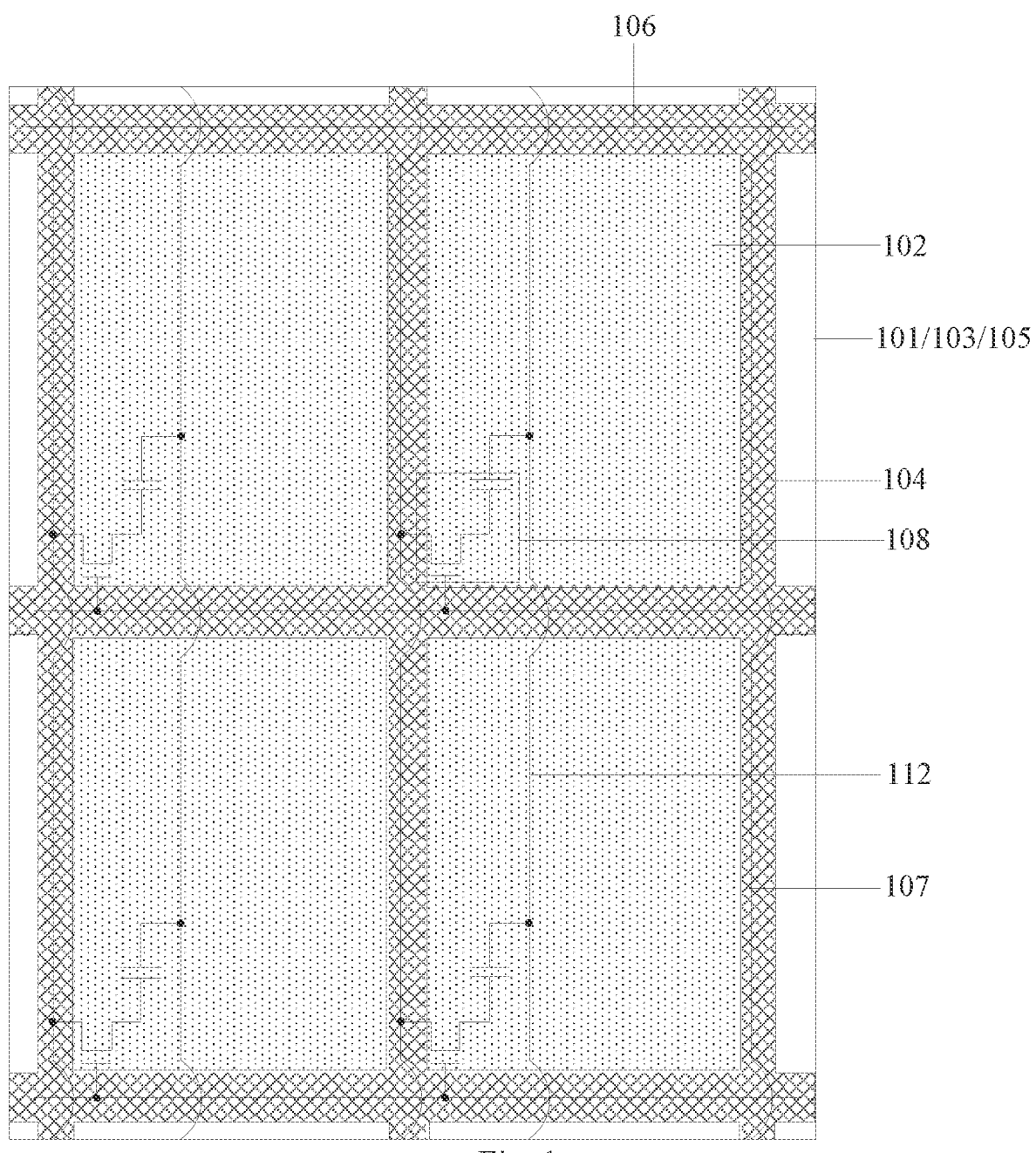
FIG. 1 is a schematic structural diagram of a detection substrate provided by an embodiment of the present disclosure.

In order to make the objectives, technical solutions and advantages of the embodiments of the present disclosure clearer, the technical solutions of the embodiments of the present disclosure are clearly and completely described below in combination with the drawings of the embodiments of the present disclosure. It should be noted that the sizes and shapes of graphs in the drawings do not reflect the true scale, and only aim at illustrating and explaining contents of the present disclosure. Identical or similar numbers show identical or similar elements or elements with identical or similar functions all the time. Obviously, the described embodiments are part of embodiments of the present disclosure, but are not all the embodiments. Based on the described embodiments of the present disclosure, all the other embodiments obtained by those of ordinary skill in the art without creative labor belong to the protection scope of the present disclosure.

Unless otherwise defined, technical terms or scientific terms used herein should have general meanings understood by people with general skills in the art of the present disclosure. 'First', 'second' and other similar words used in the specification and the claims of the present disclosure do not show any sequence, quantity or importance, but are only used for distinguishing different components. 'Comprise' or 'include' or other similar words mean that elements or objects in front of the words contain elements or objects or the like listed behind the words, but do not exclude other elements or objects. 'Inside', 'outside', 'upper'. 'lower' and the like are only used for showing relative position relationships, and when the absolute positions of the descried objects change, the relative position relationships probably change correspondingly.

A ray detector in the related art includes a thin film transistor (TFT) array, wherein each transistor is associated with one storage capacitor, and the storage capacitors are configured to collect electrons or holes converted from X rays through a photoelectric conversion layer; and the photoelectric conversion layer on a whole face is manufactured above the storage capacitors, the photoelectric conversion layer is usually made thick in order to more fully absorb the X rays, and high voltage is applied to an upper electrode and a lower electrode of the photoelectric conversion layer. As the photoelectric conversion layer is thick and most photoelectric conversion materials are sensitive to water, the photoelectric conversion layer is hardly subjected to pattern treatment, and the upper electrode of the final material is usually a metal film layer covering the whole face. In addition, in consideration of reducing coupling capacitance of scanning signal lines (Gate) and reading signal lines (Data) and then reducing noise, usually the area of the lower electrode is limited in a single detection pixel, and the lower electrode is not overlapped with the scanning signal lines and the reading signal lines around.

During actual use of the product, rays radiate the surface of the photoelectric conversion layer indistinctively, electron and hole pairs are also generated on the photoelectric conversion layer corresponding to a region between two detection pixels without the lower electrode, as an additional electric field exists in the photoelectric conversion layer, carriers transversely move to a certain degree in the photoelectric conversion layer, and then the space resolution of the product is reduced, which is embodied by lowering of the modulation transfer function (MTF) in the test process; and meanwhile, as the intensity of the electric field in the region is small, the separation capacity for the electron and hole pairs is relatively poor, the carriers are easily captured by the defect center, and then the problem of ghost shadows exists.

Some embodiments of the present disclosure provide a detection substrate in order to solve the problems in the related art, and as shown in FIG. 1, the detection substrate includes:

a base substrate 101;

a plurality of independent first electrodes 102 arranged on the base substrate 101 on the same layer;

a photoelectric conversion layer 103 arranged on a whole face of sides, facing away from the base substrate 101, of the plurality of first electrodes 102;

a ray absorption layer 104 located on a side, facing away from the plurality of first electrodes 102, of the photoelectric conversion layer 103, wherein an orthographic projection of the ray absorption layer 104 on the base substrate 101 is completely overlapped with an orthographic projection of gaps between the first electrodes 102 on the base substrate 101; and a second electrode 105 arranged on a whole face of a side, facing away from the plurality of first electrodes 102, of the photoelectric conversion layer 103.

In the detection substrate provided by embodiments of the present disclosure, as the ray absorption layer 104 is arranged at the position, corresponding to gap regions of the first electrodes 102, above the photoelectric conversion layer 103, the ray absorption layer 104 absorbs rays in the gap regions of the first electrodes 102 as much as possible, then the rays in the gap regions of the first electrodes 102 reach the photoelectric conversion layer 103 as little as possible, in other words, fewer carriers exist in the gap regions of the first electrodes 102, and even when an additional electric field exists, the high space resolution can still be obtained. In addition, as the number of the carriers generated in the gap regions of the first electrodes 102 is extremely small, the problem of ghost shadows caused by the fact that the carriers are captured by the defect center is effectively solved. In addition, no first electrode 102 is arranged in the gap regions of the first electrodes 102, so detection of the photoelectric conversion layer 103 in the effective detection region where the first electrodes 102 are located to the rays is not affected theoretically, and therefore the photoelectric detection efficiency cannot be affected, in other words, the detection sensitivity is not affected by the ray absorption layer 104.

Optionally, in the detection substrate provided by some embodiments of the present disclosure, in consideration of the situation that the line width of the ray absorption layer 104 is small compared with the gap width of the first electrodes, the capacity of increasing the space resolution is weakened to a certain degree; and in consideration of the situation that the line width is large, the sensitivity of detection of the product to the rays is reduced to a certain degree. Thus, preferably, in the present disclosure, the orthographic projection of the ray absorption layer 104 on the base substrate 101 is completely overlapped with the orthographic projection of the gaps between the first electrodes 102 on the base substrate 101. In other words, it is the best when the line width of the ray absorption layer 104 is equal to the gap width of the first electrodes 102. However, limited by the process capacity, the line width of the ray absorption layer 104 is possibly not completely equal to the gap width of the first electrodes 102, and thus, the error allowed by the process can exist between the line width and the gap width.

Optionally, in the detection substrate provided by some embodiments of the present disclosure, as the absorption coefficient $\mu$ of the ray absorption layer 104 to the rays and the atomic coefficient Z of the material of the ray absorption layer meet the relational expression: $\mu \propto Z^4$, the larger the atomic coefficient Z of the ray absorption layer 104 is, the higher the absorption capacity of the ray absorption layer to the rays is. Based on this, in order to effectively absorb the rays corresponding to the gap regions of the first electrodes 102, at least one of heavy metal (such as tungsten and lead), heavy metal alloy and heavy metal compounds with the large atomic coefficients can be adopted for manufacturing the ray absorption layer 104. In addition, under the condition that the material with the large atomic coefficient Z is adopted for manufacturing the ray absorption layer 104, the rays can be fully attenuated through the thin ray absorption layer 104 so that the thickness of the ray absorption layer 104 can be effectively reduced in order to achieve thin design.

Optionally, in the detection substrate provided by some embodiments of the present disclosure, the ray absorption layer 104 can be located between the photoelectric conversion layer 103 and the second electrode 105, or the ray absorption layer 104 can be located on the side, facing away from the photoelectric conversion layer 103, of the second electrode 105.

Optionally, in the detection substrate provided by some embodiments of the present disclosure, in order to avoid introduction of additional electric fields and capacitors, the ray absorption layer 104 can directly make contact with the second electrode 105.

Optionally, in the detection substrate provided by some embodiments of the present disclosure, as shown in FIG. 1, the detection substrate further can include: scanning signal lines 106 and reading signal lines 107 located between the base substrate 101 and a layer where the plurality of first electrodes 102 are located; and the orthographic projection of the ray absorption layer 104 on the base substrate 101 completely covers an orthographic projection of the scanning signal lines 106 and the reading signal lines 107 on the base substrate 101. Under the condition that the ray absorption layer 104 and the second electrode 105 are in short circuit, no additional influence is generated to the scanning signal lines 106 and the reading signal lines 107 below.

Optionally, in the detection substrate provided by some embodiments of the present disclosure, the photoelectric conversion layer 103 can be a direct conversion material layer or an indirect conversion material layer, and is not limited herein.

In the ray detection process, the direct conversion material layer can absorb the carriers generated by the rays, and electron-hole pairs contained in the carriers drift to the first electrodes 102 and the second electrode 105 under the electric field effect, and are directly collected by the first electrodes 102 and the second electrode 105, so that current signals are generated. Optionally, the direct conversion material layer can be made of mercury iodide ($HgI_2$), lead iodide ($PbI_2$), bismuth iodide ($BiI_2$) and the like.

When the photoelectric conversion layer 103 is the indirect conversion material layer, the photoelectric conversion layer usually further includes a scintillant layer on a side, facing away from the photoelectric conversion layer 103, of the second electrode 105. In the ray detection process, the rays are converted into visible light through the scintillant layer, the visible light is further converted into the carriers through the indirect conversion material layer, and electron-hole pairs contained in the carriers drift to the first electrodes 102 and the second electrode 105 under the electric field effect, and are directly collected by the first electrodes 102 and the second electrode 105, so that current signals are generated.

Optionally, in the detection substrate provided by some embodiments of the present disclosure, as shown in FIG. 1, the detection substrate further can include: a plurality of detection circuits 108 located on a side, facing the plurality of first electrodes 102, of the base substrate 101, wherein each detection circuit 108 is electrically connected with one first electrode 102 correspondingly. In some embodiments, each detection circuit 108 can include a transistor and a storage capacitor, and in consideration of reducing coupling capacitance of the scanning signal lines 106 and the reading signal lines 107, and then reducing noise, the area of the storage capacitor can be limited in a single detection pixel, and the storage capacitor is not overlapped with the scanning signal lines 106 and the reading signal lines 107 around. The transistors can be oxide transistors or low-temperature polycrystalline silicon transistors or amorphous silicon transistors.

Based on the same inventive concept, some embodiments of the present disclosure provides a manufacturing method of the detection substrate. As the principle of solving problems of the manufacturing method is similar to the principle of solving problems of the detection substrate, implementation of the manufacturing process provided by the embodiment of the present disclosure can refer to implementation of the detection substrate provided by embodiments of the present disclosure, and the repetitions are omitted.

Figure 2:
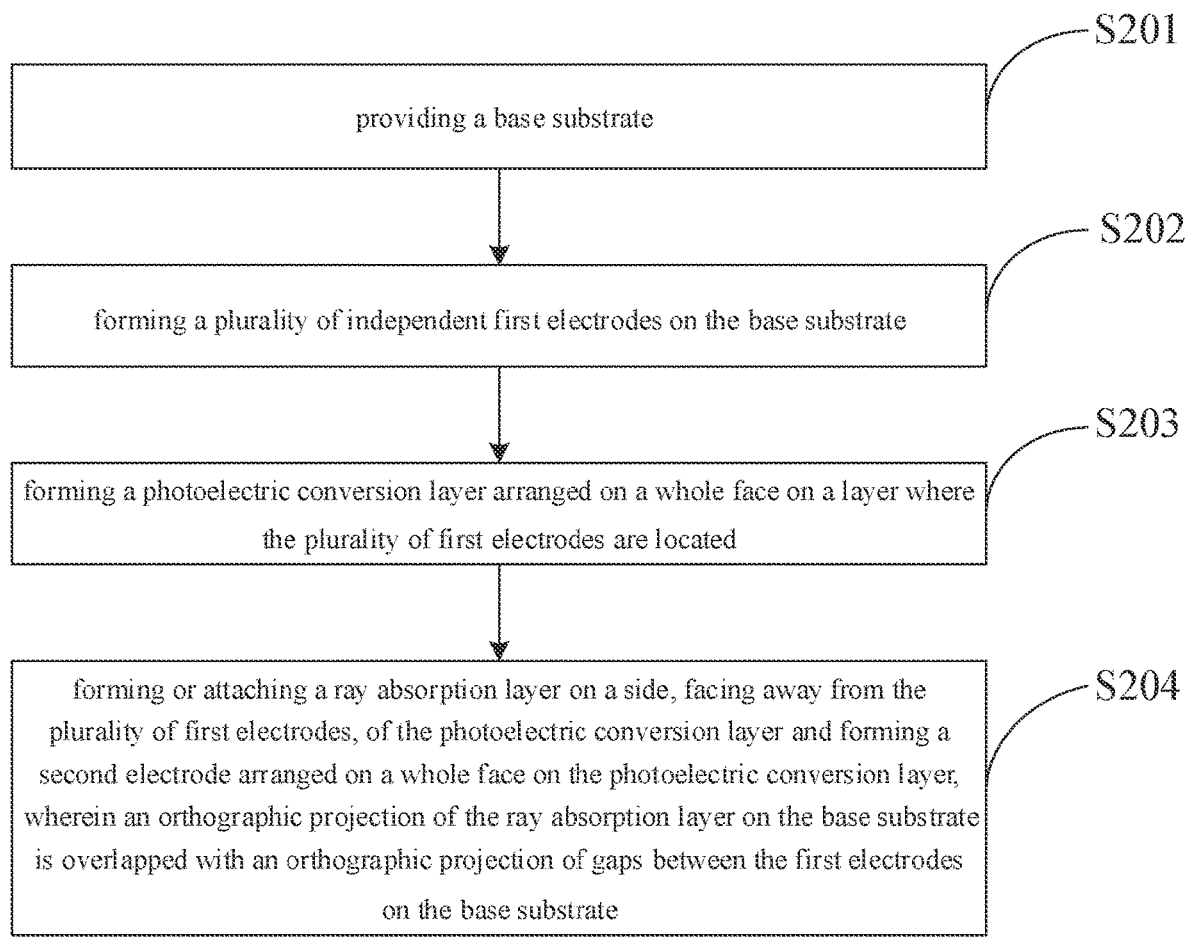
FIG. 2 is a flow diagram of a manufacturing method of a detection substrate provided by an embodiment of the present disclosure.

As shown in FIG. 2, the manufacturing method of the detection substrate provided by some embodiments of the present disclosure can include the following steps:

S201, a base substrate is provided:

S202, a plurality of independent first electrodes are formed on the base substrate;

S203, a photoelectric conversion layer is formed arranged on a whole face on a layer where the plurality of first electrodes are located; and S204, a ray absorption layer is formed or attached on a side, facing away from the plurality of first electrodes, of the photoelectric conversion layer and a second electrode is formed arranged on a whole face on the photoelectric conversion layer, wherein an orthographic projection of the ray absorption layer on the base substrate is overlapped with an orthographic projection of gaps between the first electrodes on the base substrate.

In order to better understand the manufacturing method provided by the present disclosure, the detailed manufacturing process is explained as follows. Optionally, FIG. 3-FIG. 15 show a schematic structural diagram of one detection pixel in the manufacturing process, wherein the ray absorption layer 104 is arranged above the second electrode 105.

Figure 3:
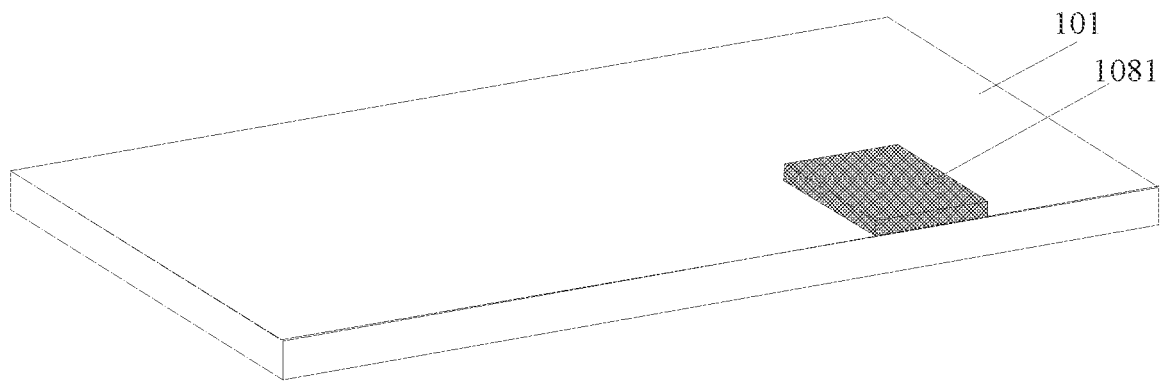
FIG. 3 is a schematic structural diagram of a detection substrate obtained after a first step of the manufacturing method finishing.

Firstly, as shown in FIG. 3, a gate electrode 1081 of a transistor is formed on the base substrate 101.

Figure 4:
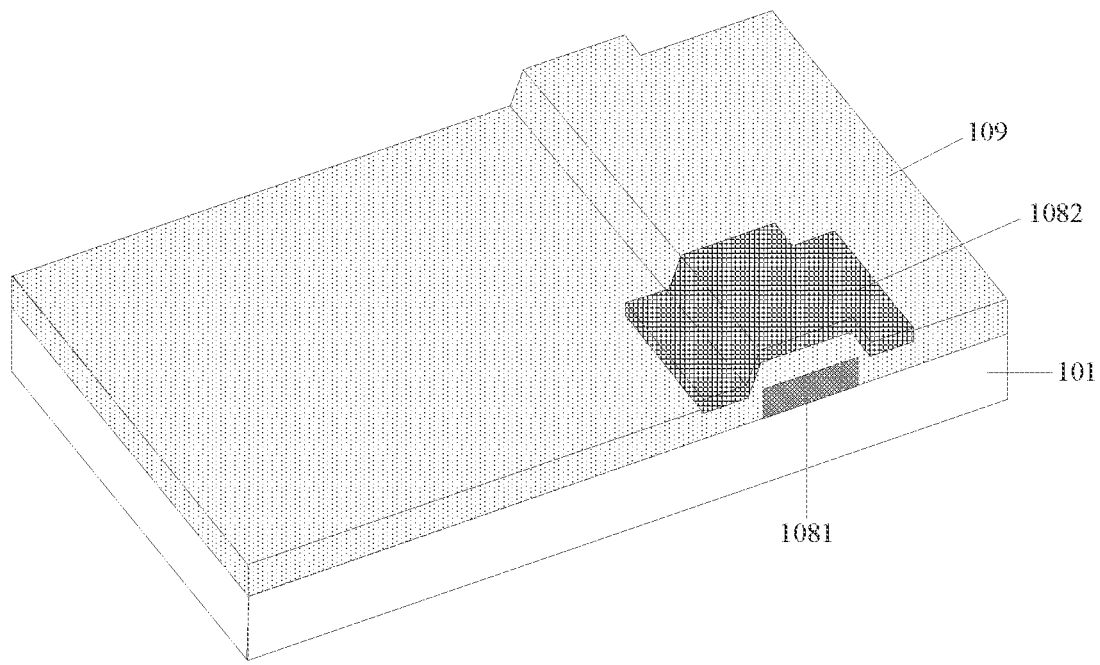
FIG. 4 is a schematic structural diagram of a detection substrate obtained after a second step of the manufacturing method finishing.

Secondly, as shown in FIG. 4, a gate insulating layer 109 arranged on a whole face and an active layer 1082 contained in the transistor in the detection pixel are formed on a layer where the gate electrode 1081 is located.

Figure 5:
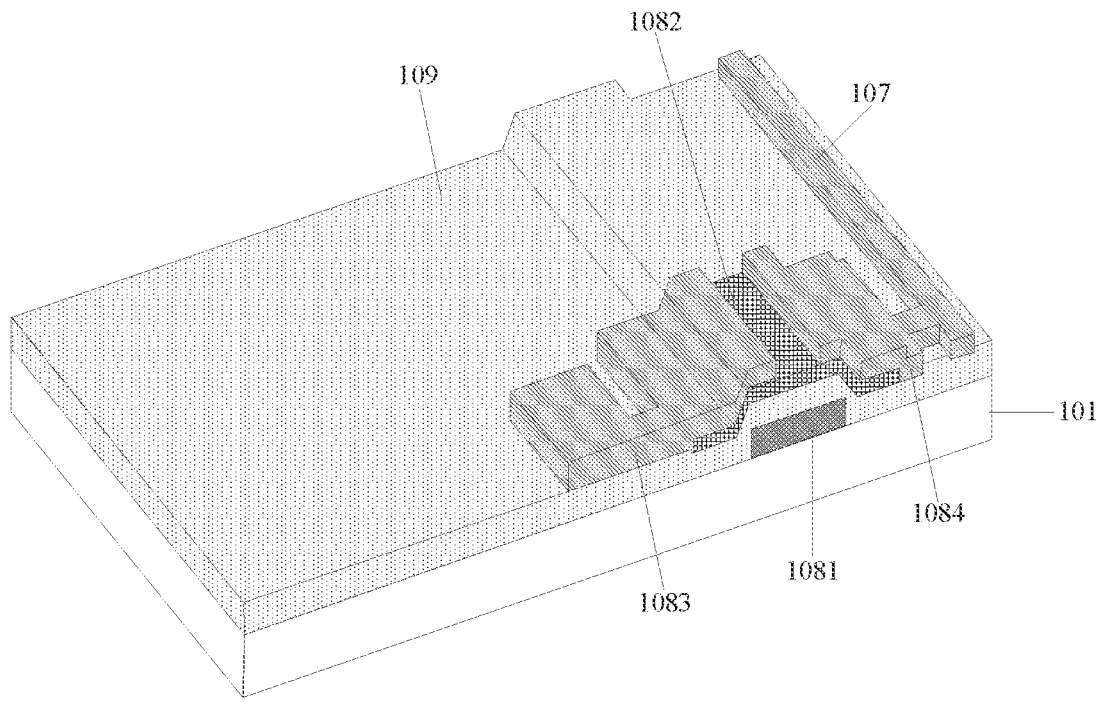
FIG. 5 is a schematic structural diagram of a detection substrate obtained after a third step of the manufacturing method finishing.

Thirdly, as shown in FIG. 5, a source electrode 1083 and a drain electrode 1084 of the transistor and reading signal lines 107 are formed on the active layer 1082.

Figure 6:
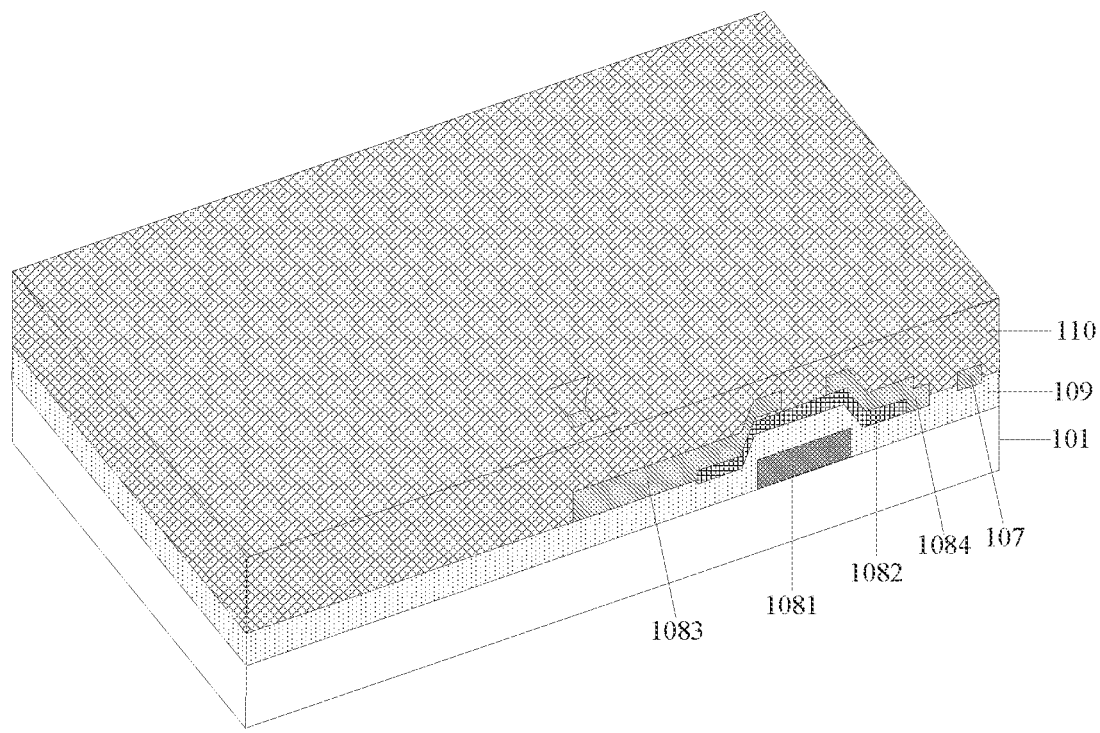
FIG. 6 is a schematic structural diagram of a detection substrate obtained after a fourth step of the manufacturing method finishing.

Fourthly, as shown in FIG. 6, a first insulating layer 110 arranged on a whole face is formed on a layer where the source electrode 1083, the drain electrode 1084 and the reading signal lines 107 are located. Optionally, the first insulating layer 110 can include an inorganic insulating layer (such as a silicon oxide layer and a silicon nitride layer) to serve as a blocking layer material, and meanwhile adhesive force with the following first electrodes 102 is improved. In some embodiments, the first insulating layer 110 further can include an organic insulating layer (such as a resin layer) stacked on the inorganic insulating layer, and thus, the relevant coupling capacitance of the reading signal lines 107 can be reduced to a certain degree, and then the product noise is reduced.

Figure 7:
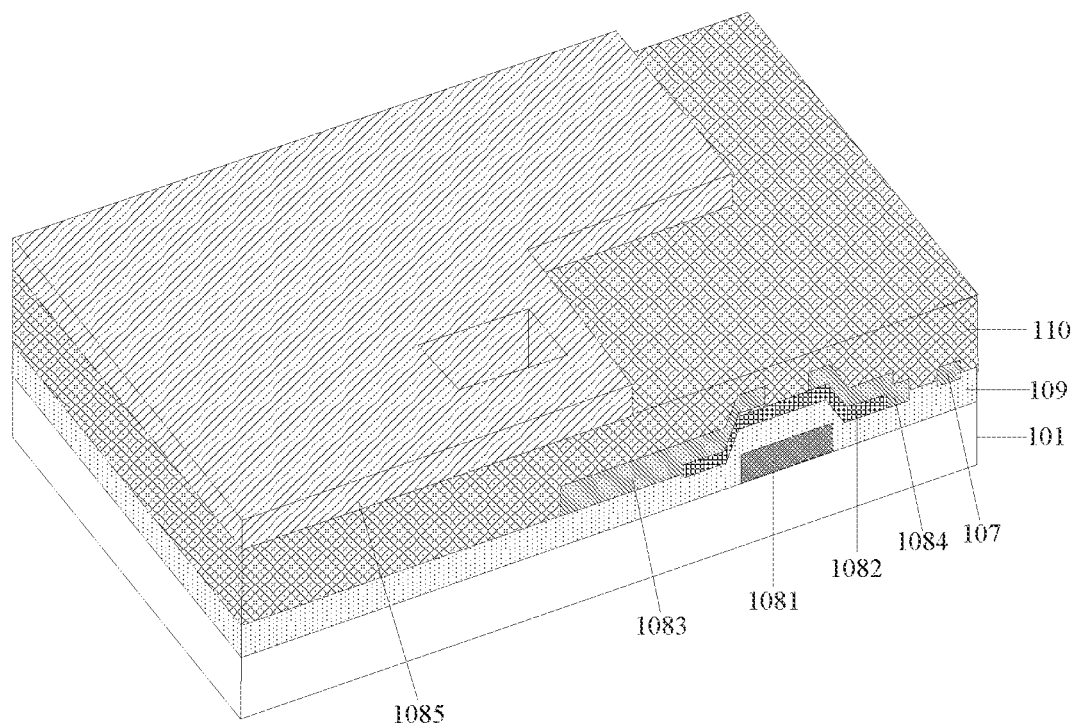
FIG. 7 is a schematic structural diagram of a detection substrate obtained after a fifth step of the manufacturing method finishing.

Fifthly, as shown in FIG. 7, a first capacitance electrode 1085 located in the detection pixel is formed on the first insulating layer 110 and used for storing electric signals.

Figure 8:
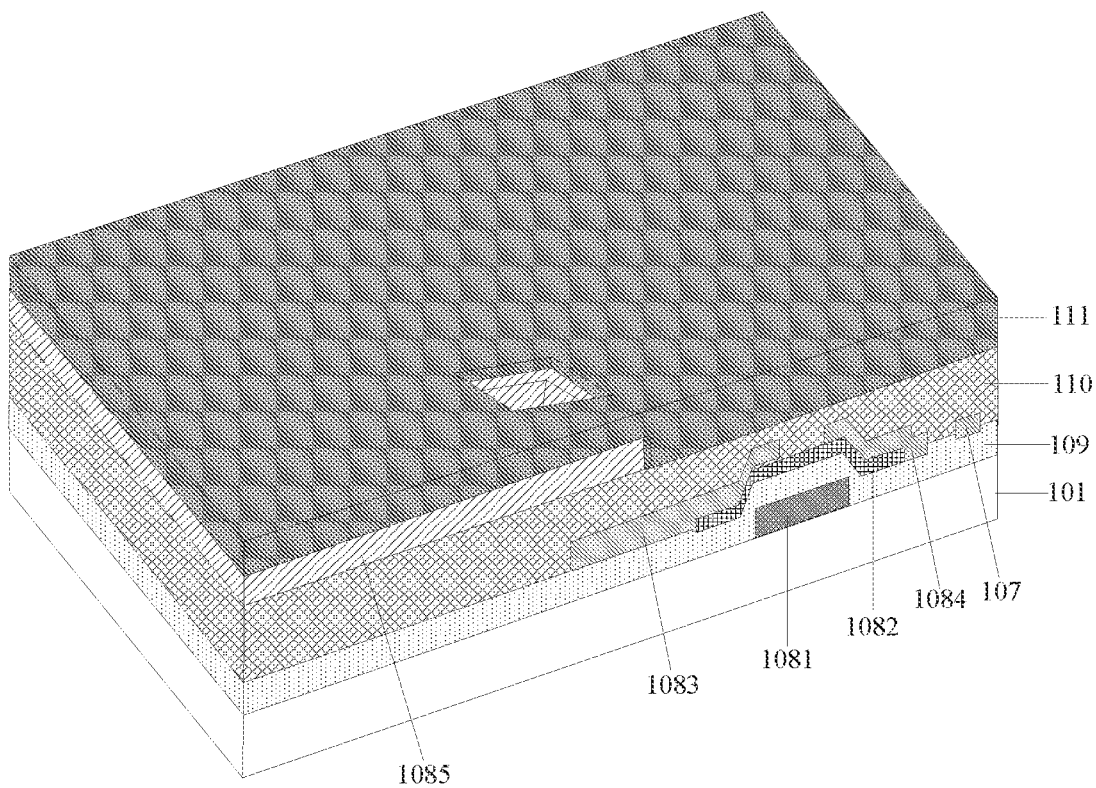
FIG. 8 is a schematic structural diagram of a detection substrate obtained after a sixth step of the manufacturing method finishing.

Sixthly, as shown in FIG. 8, a second insulating layer 111 arranged on a whole face is formed on the first capacitance electrode 1085 to serve as a capacitance medium layer.

Figure 9:
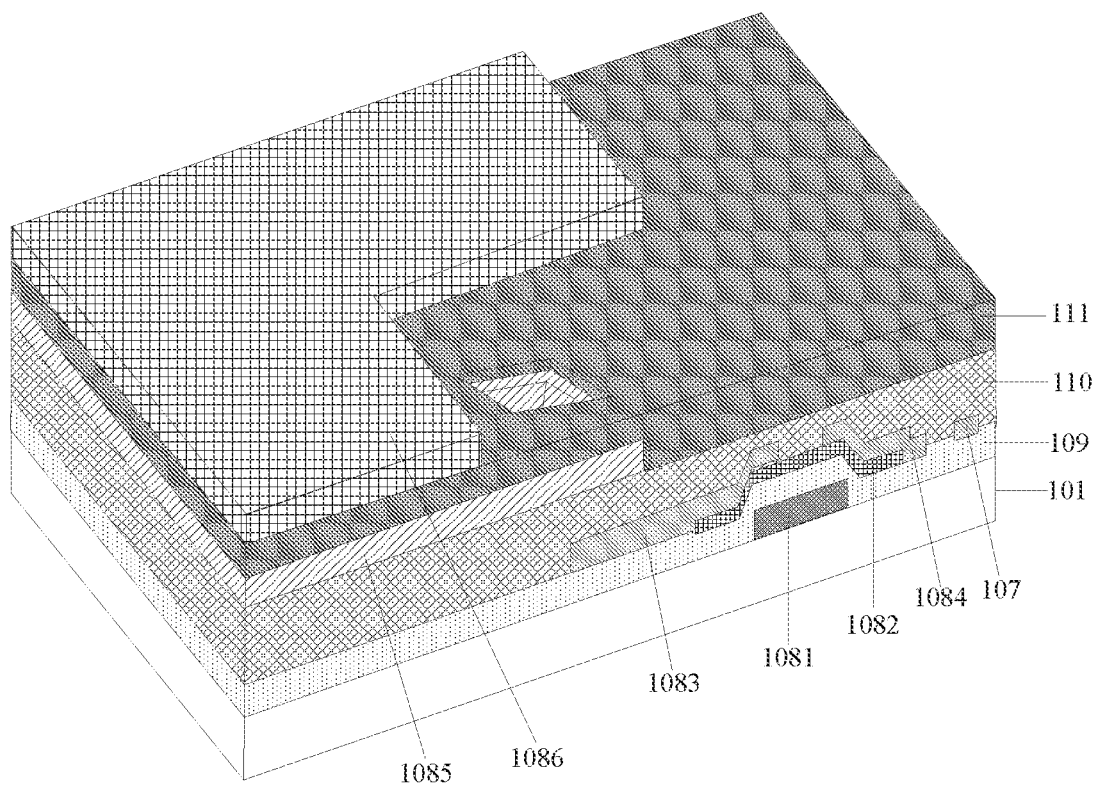
FIG. 9 is a schematic structural diagram of a detection substrate obtained after a seventh step of the manufacturing method finishing.

Seventhly, as shown in FIG. 9, a second capacitance electrode 1086 located in the detection pixel and overlapped with the first capacitance electrode 1085 is formed on the second insulating layer 111. A storage capacitor is formed by the first capacitance electrode 1085 and the second capacitance electrode 1086.

Figure 10:
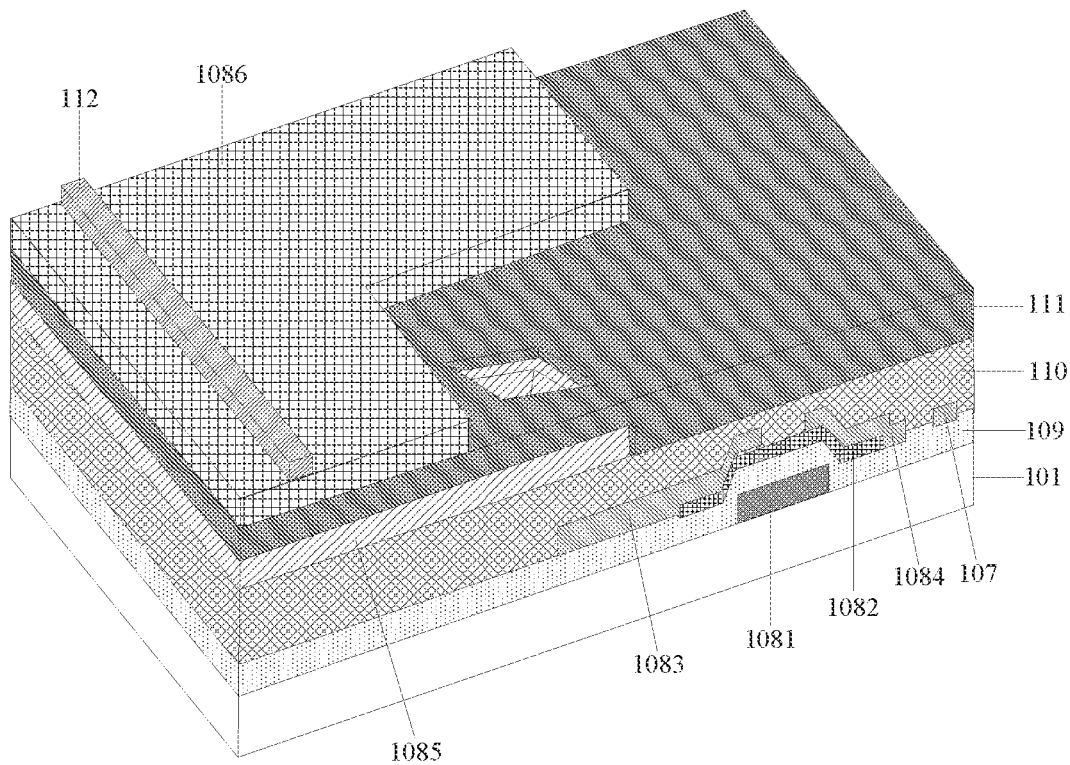
FIG. 10 is a schematic structural diagram of a detection substrate obtained after a eighth step of the manufacturing method finishing.

Eighthly, as shown in FIG. 10, a grounding wire 112 electrically connected with the second capacitance electrode is formed on the second capacitance electrode 1086, and the grounding wire 112 is used for providing grounding signals (GND) to the second capacitance electrode 1086.

Figure 11:
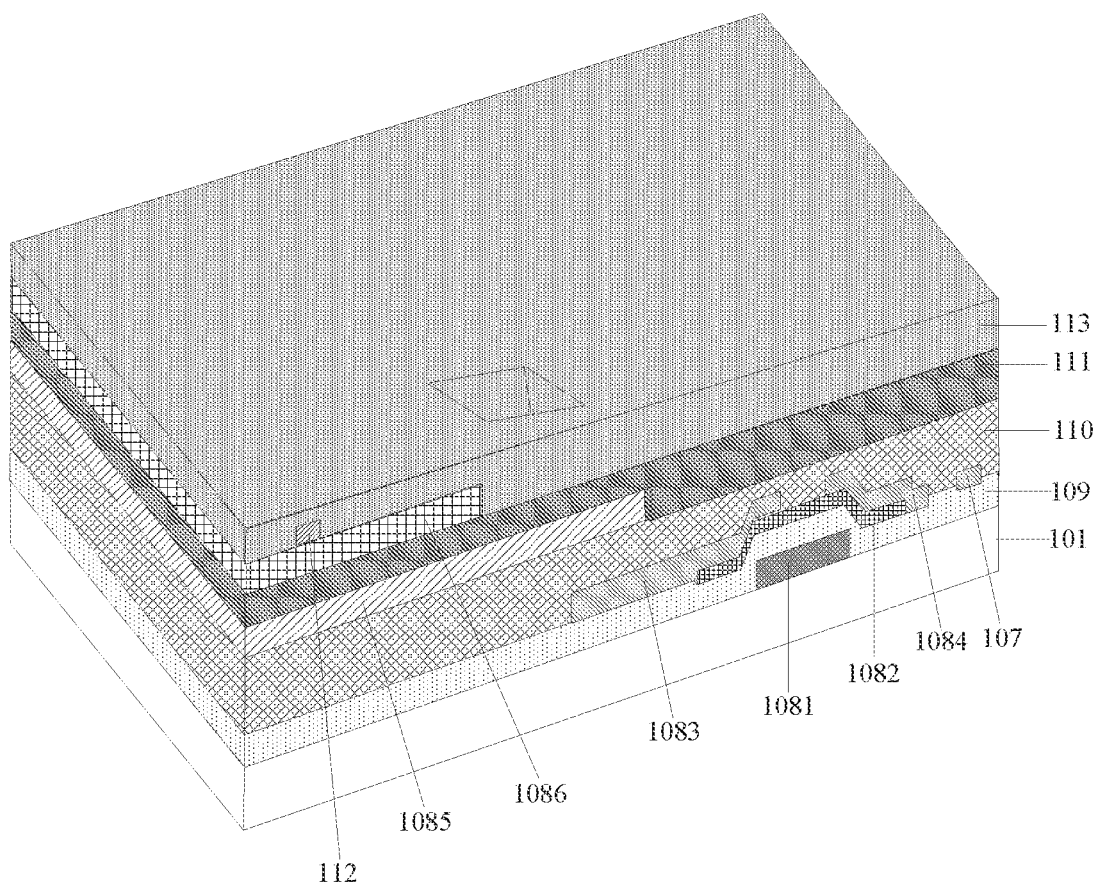
FIG. 11 is a schematic structural diagram of a detection substrate obtained after a ninth step of the manufacturing method finishing.

Ninthly, as shown in FIG. 11, a flat layer 113 (such as a resin layer) arranged on a whole face is formed on the grounding wire 112, the flat layer 113 can provide a flat surface for following manufacturing of the first electrodes 102, and meanwhile stray capacitance formed by the first electrodes 102, the reading signal lines 107 and the like can be reduced. Optionally, the first electrodes 102 can be made of indium tin oxide and the like.

Figure 12:
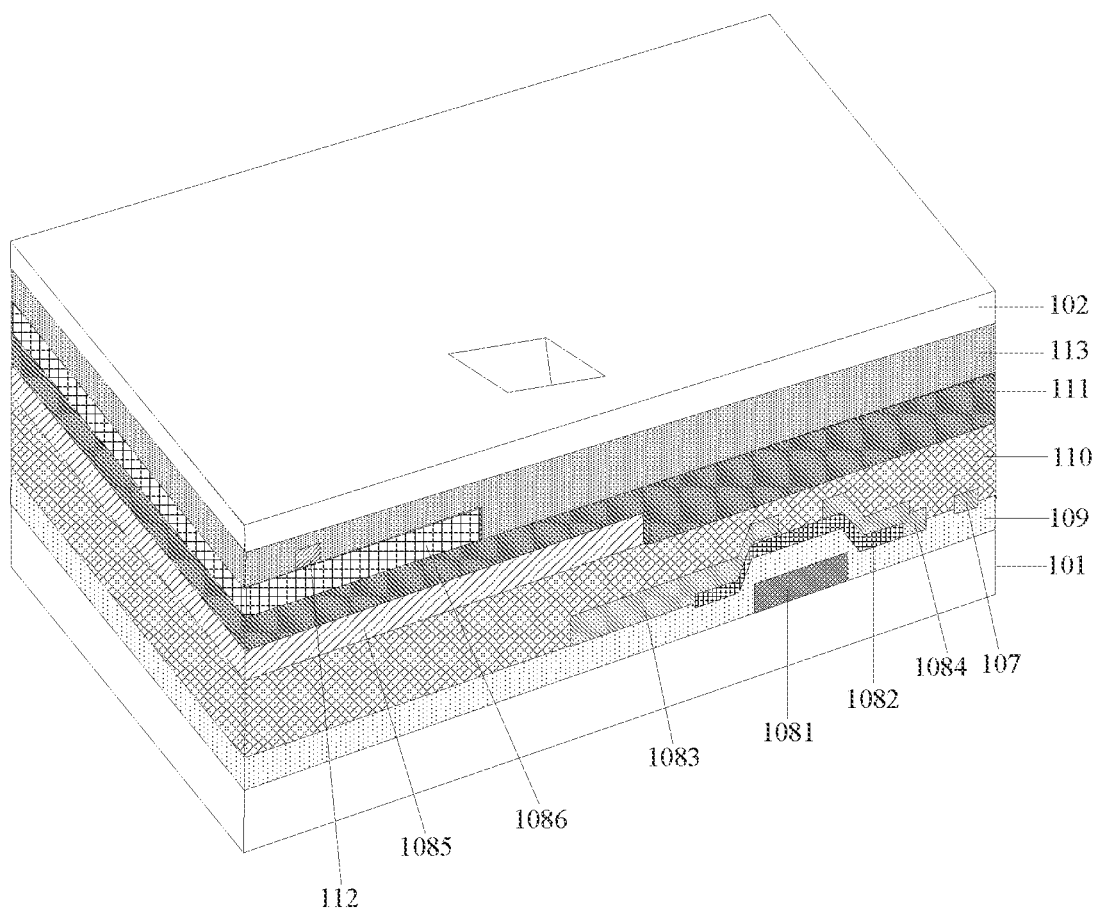
FIG. 12 is a schematic structural diagram of a detection substrate obtained after a tenth step of the manufacturing method finishing.

Tenthly, as shown in FIG. 12, the first electrodes 102 located in the detection pixel are formed on the flat layer 113.

Figure 13:
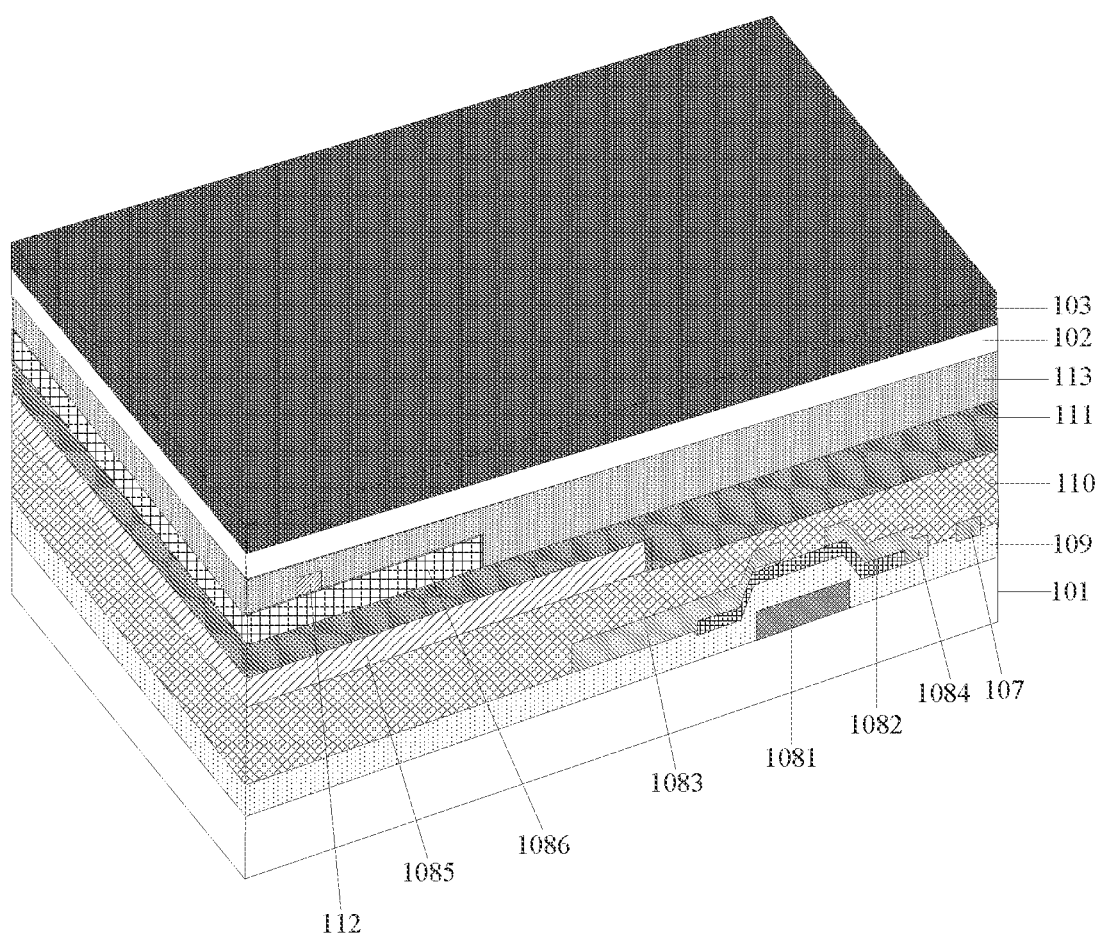
FIG. 13 is a schematic structural diagram of a detection substrate obtained after an eleventh step of the manufacturing method finishing.

Eleventhly, as shown in FIG. 13, a photoelectric conversion layer 103 arranged on a whole face is formed on a layer where the first electrodes 102 are located through a physical vapor deposition (PVD) solution method, a sol-gel method and the like. The direct photoelectric conversion layer 103 specifically can be made of but is not limited to amorphous selenium, mercury iodide (HgI), perovskite materials, zinc oxide (ZnO) and the like.

Figure 14:
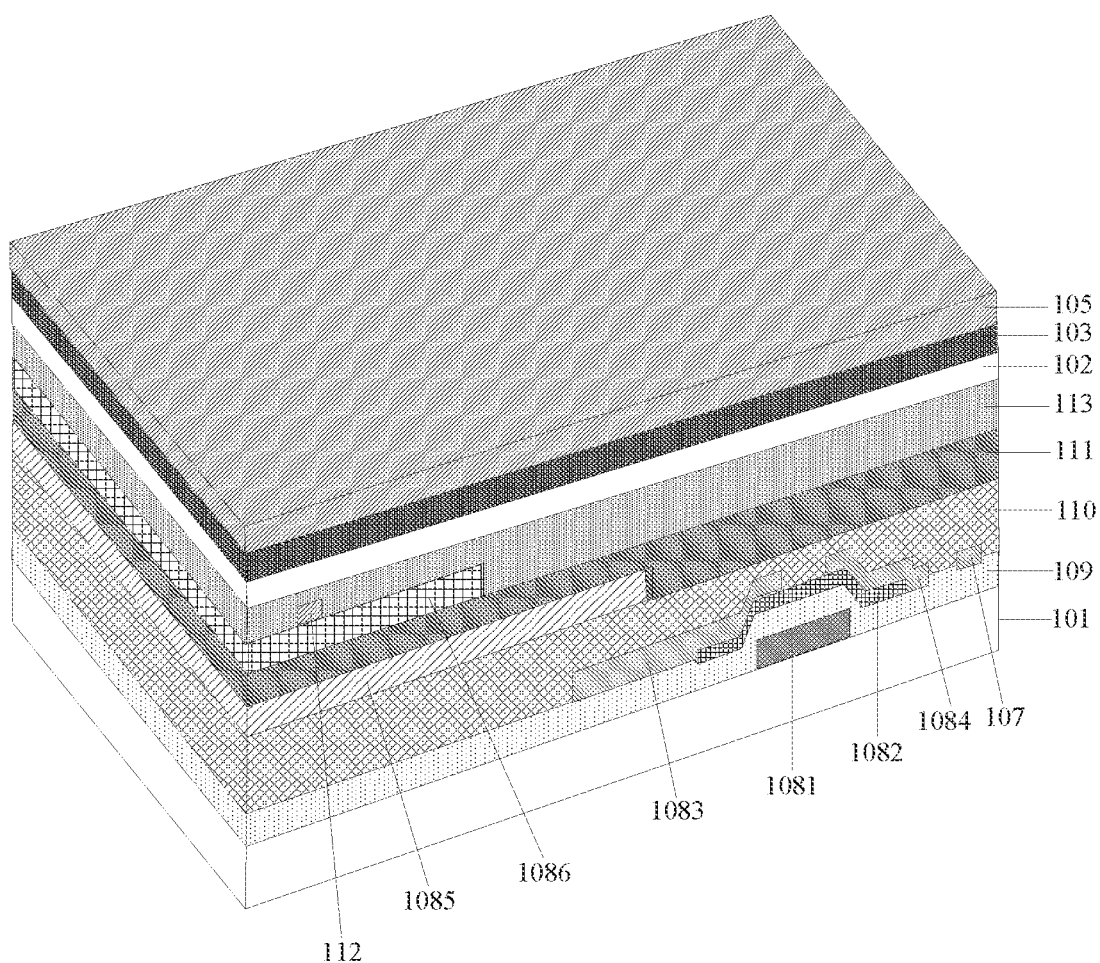
FIG. 14 is a schematic structural diagram of a detection substrate obtained after a twelfth step of the manufacturing method finishing.

Twelfthly, as shown in FIG. 14, a second electrode 105 arranged on a whole face is formed on the photoelectric conversion layer 103 through a physical vapor deposition method, an atomic layer deposition (ALD) method, a sputter method, an electroplating method, a method of pasting a metal film under a vacuum environment and the like, so that the packaging airtightness of the photoelectric conversion layer 103 is guaranteed, and meanwhile good contact between the second electrode 105 and the photoelectric conversion layer 103 is guaranteed.

Figure 15:
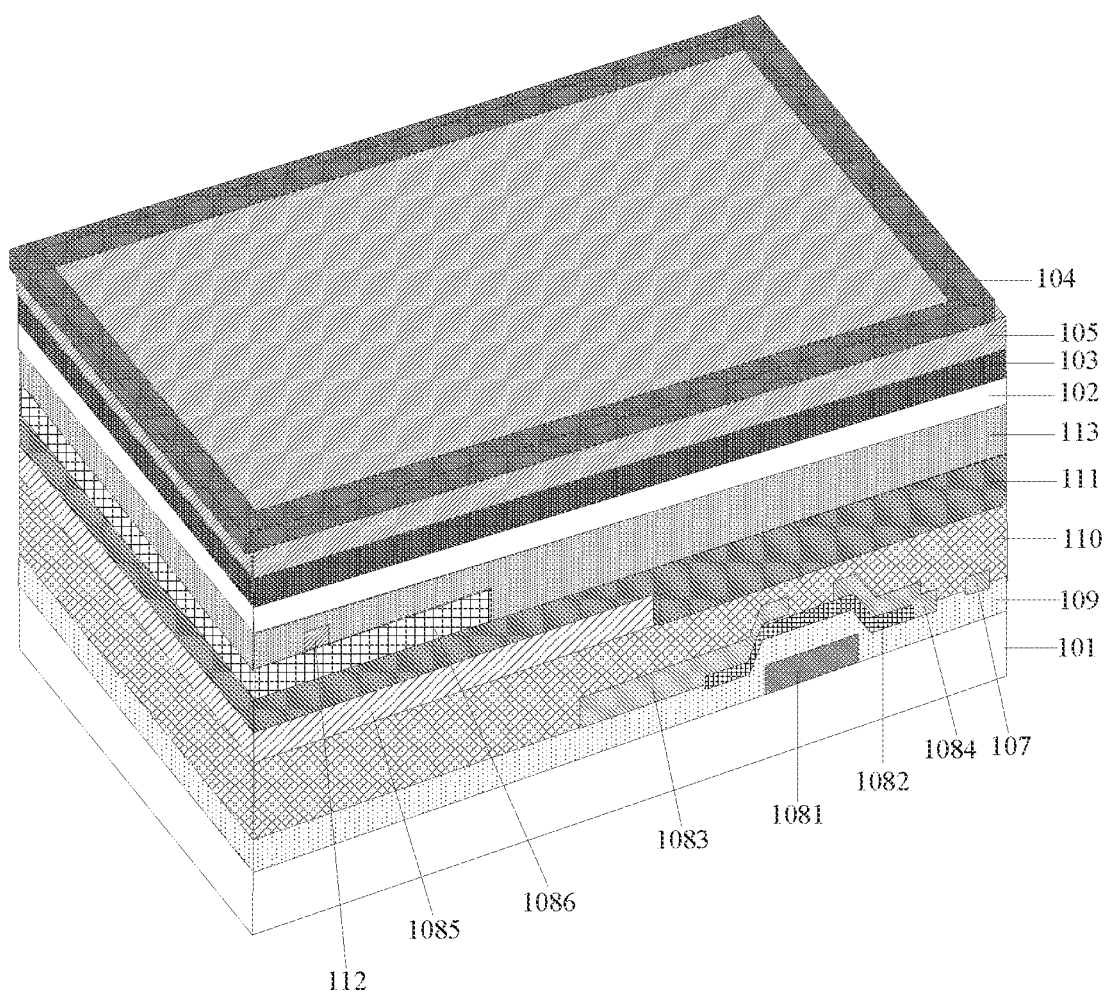
FIG. 15 a schematic structural diagram of a detection substrate obtained after a thirteenth step of the manufacturing method finishing.

Thirteenthly, as shown in FIG. 15, a ray absorption layer 104 in short circuit with the second electrode is formed on the second electrode 105, and an orthographic projection of the ray absorption layer 104 on the base substrate 101 is overlapped with an orthographic projection of gaps between the first electrodes 102 on the base substrate 101. Of course, during specific implementation, the ray absorption layer 104 can be made in advance and attached to the second electrode 105, which is not limited herein.

So far, the detection substrate provided by some embodiments of the present disclosure is manufactured.

It should be noted that in the manufacturing method provided by the embodiment of the present disclosure, composition processes involved by forming all the layers of structures can include part or all of the process procedures of deposition, photoresist coating, mask masking, exposure, developing, etching, photoresist stripping and the like and can further include other process procedures, which is specifically based on graphs needing to be formed in the actual manufacturing process, and is not limited herein. For example, a postbaking process can be included after developing and before etching.

The deposition process can be chemical vapor deposition or plasma enhanced chemical vapor deposition or physical vapor deposition, and is not limited herein; a mask used in the masking process can be a half tone mask or a single slit mask or a gray tone mask, and is not limited herein; and etching can be dry etching or wet etching, and is not limited herein.

Based on the same inventive concept, some embodiments of the present disclosure further provide a ray detector including the detection substrate provided by some embodiments of the present disclosure. Other essential components of the ray detector should be understood by those ordinarily skilled in the art, which is not repeated herein, and should not limit the present disclosure. In addition, as the principle of solving problems of the ray detector is similar to the principle of solving problems of the detection substrate, implementation of the ray detector can refer to implementation of the detection substrate, and repetitions are omitted.

Some embodiments of the present disclosure provide the detection substrate, the manufacturing method thereof and the ray detector. The detection substrate includes: the base substrate; the plurality of independent first electrodes arranged on the base substrate on the same layer; the photoelectric conversion layer arranged on the whole face of the sides, facing away from the base substrate, of the plurality of first electrodes; the ray absorption layer located on the side, facing away from the plurality of first electrodes, of the photoelectric conversion layer, wherein the orthographic projection of the ray absorption layer on the base substrate is overlapped with the orthographic projection of the gaps between the first electrodes on the base substrate, and the second electrode arranged on the whole face of the side, facing away from the plurality of first electrodes, of the photoelectric conversion layer. As the ray absorption layer is arranged at the position, corresponding to the gap regions of the first electrodes, above the photoelectric conversion layer, the ray absorption layer absorbs rays in the gap regions of the first electrodes as much as possible, then the rays in the gap regions of the first electrodes reach the photoelectric conversion layer as little as possible, in other words, fewer carriers exist in the gap regions of the first electrodes, and even when an additional electric field exists, the high space resolution can still be obtained. In addition, as the number of the carriers generated in the gap regions of the first electrodes is extremely small, the problem of ghost shadows caused by the fact that the carriers are captured by the defect center is effectively solved. In addition, as no first electrode is arranged in the gap regions of the first electrodes, so detection of the photoelectric conversion layer in the effective detection region where the first electrodes are located to the rays cannot be affected theoretically, and therefore the photoelectric detection efficiency cannot be affected, in other words, the detection sensitivity is not affected by the ray absorption layer.

Obviously, those skilled in the art can perform various kinds of change and modification on the present disclosure without departing from the spirit and scope of the present disclosure. Thus, if the change and modification of the present disclosure belong to the claims of the present disclosure and the range of their equivalent technologies, the present disclosure also intends to include the change and modification.

What is claimed is:

1. A detection substrate, comprising:
    a base substrate;
    a plurality of independent first electrodes arranged in a same layer on the base substrate;
    a photoelectric conversion layer arranged on a whole face of sides, facing away from the base substrate, of the plurality of first electrodes;
    a ray absorption layer located on a side, facing away from the plurality of first electrodes, of the photoelectric conversion layer, wherein an orthographic projection of the ray absorption layer on the base substrate is overlapped with an orthographic projection of gaps between the first electrodes on the base substrate; and
    a second electrode arranged on a whole face of a side, facing away from the plurality of first electrodes, of the photoelectric conversion layer;
    wherein the ray absorption layer is directly in contact with the second electrode.

2. The detection substrate according to claim 1, wherein the orthographic projection of the ray absorption layer on the base substrate is completely overlapped with the orthographic projection of the gaps between the first electrodes on the base substrate.

3. The detection substrate according to claim 1, wherein the ray detection layer is made of at least one of heavy metal, heavy metal alloy or a heavy metal compound.

4. The detection substrate according to claim 1, wherein the ray absorption layer is located between the photoelectric conversion layer and the second electrode, or the ray absorption layer is located on a side, facing away from the photoelectric conversion layer, of the second electrode.

5. The detection substrate according to claim 1, further comprising: scanning signal lines and reading signal lines located between the base substrate and a layer where the plurality of first electrodes are located; wherein
    the orthographic projection of the ray absorption layer on the base substrate completely covers an orthographic projection of the scanning signal lines and the reading signal lines on the base substrate.

6. The detection substrate according to claim 1, wherein the photoelectric conversion layer is a direct conversion material layer or an indirect conversion material layer.

7. The detection substrate according to claim 1, further comprising: a plurality of detection circuits located on a side, facing the plurality of first electrodes, of the base substrate, wherein each detection circuit is electrically connected with one first electrode correspondingly.

8. A manufacturing method of the detection substrate according to claim 1, comprising:
    providing a base substrate;
    forming a plurality of independent first electrodes on the base substrate;
    forming a photoelectric conversion layer arranged on a whole face on a layer where the plurality of first electrodes are located; and
    forming or attaching a ray absorption layer on a side, facing away from the plurality of first electrodes, of the photoelectric conversion layer and forming a second electrode arranged on a whole face on the photoelectric conversion layer, wherein an orthographic projection of the ray absorption layer on the base substrate is overlapped with an orthographic projection of gaps between the first electrodes on the base substrate.

9. A ray detector, comprising a detection substrate, wherein the detection substrate comprises:
    a base substrate;
    a plurality of independent first electrodes arranged in a same layer on the base substrate;
    a photoelectric conversion layer arranged on a whole face of sides, facing away from the base substrate, of the plurality of first electrodes;
    a ray absorption layer located on a side, facing away from the plurality of first electrodes, of the photoelectric conversion layer, wherein an orthographic projection of the ray absorption layer on the base substrate is overlapped with an orthographic projection of gaps between the first electrodes on the base substrate; and
    a second electrode arranged on a whole face of a side, facing away from the plurality of first electrodes, of the photoelectric conversion layer;
    wherein the ray absorption layer is directly in contact with the second electrode.

10. The ray detector according to claim 9, wherein the orthographic projection of the ray absorption layer on the base substrate is completely overlapped with the orthographic projection of the gaps between the first electrodes on the base substrate.

11. The ray detector according to claim 9, wherein the ray detection layer is made of at least one of heavy metal, heavy metal alloy or a heavy metal compound.

12. The ray detector according to claim 9, wherein the ray absorption layer is located between the photoelectric conversion layer and the second electrode, or the ray absorption layer is located on a side, facing away from the photoelectric conversion layer, of the second electrode.

13. The ray detector according to claim 9, wherein the detection substrate further comprises: scanning signal lines and reading signal lines located between the base substrate and a layer where the plurality of first electrodes are located; wherein the orthographic projection of the ray absorption layer on the base substrate completely covers an orthographic projection of the scanning signal lines and the reading signal lines on the base substrate.

14. The ray detector according to claim 9, wherein the photoelectric conversion layer is a direct conversion material layer or an indirect conversion material layer.

15. The ray detector according to claim 9, wherein the detection substrate further comprises: a plurality of detection circuits located on a side, facing the plurality of first electrodes, of the base substrate, wherein each detection circuit is electrically connected with one first electrode correspondingly.

* * * * *